May 23, 1967 E. L. SWARTZ 3,320,966

FLUID OSCILLATOR

Filed Dec. 31, 1964

INVENTOR.
ELMER L. SWARTZ

BY Harry M. Saragovitz, Edward J. Kelly, Herbert Berl & J. D. Edgerton
ATTORNEYS

United States Patent Office 3,320,966
Patented May 23, 1967

3,320,966

FLUID OSCILLATOR

Elmer L. Swartz, Falls Church, Va., assignor to the United States of America as represented by the Secretary of the Army Filed Dec. 31, 1964, Ser. No. 422,866
1 Claim. (Cl. 137—81.5)

Figures 1, 2:
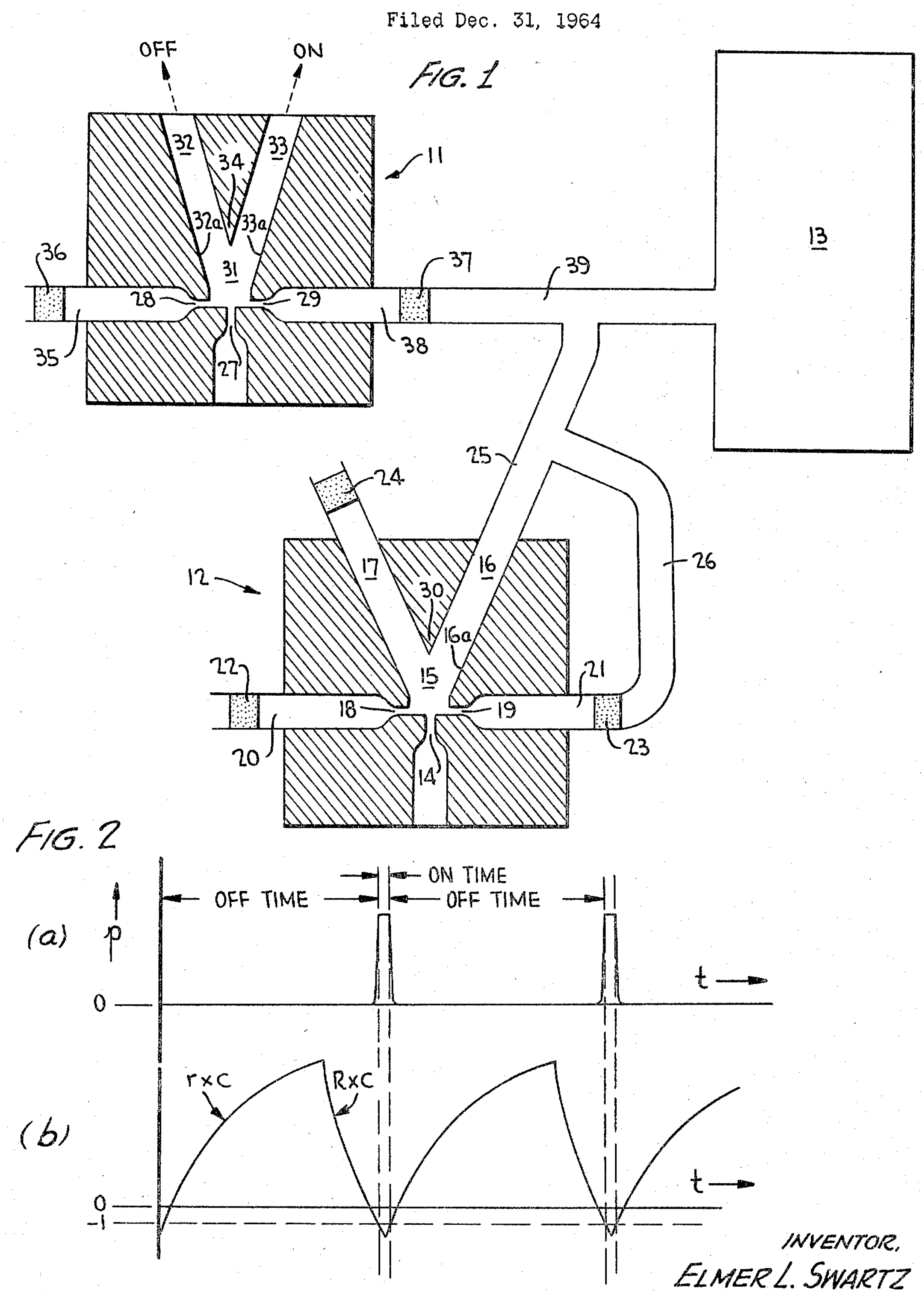

The invention described herein may be manufactured and used by or for the Government of the United States of America for governmental purposes without the payment to me of any royalty thereon.

This invention relates to pure fluid amplifiers and more particularly to a pure fluid low-frequency oscillator.

Fluid oscillators of various types have been successfully developed for use in a number of pure fluid amplifier systems such as timers, counters, computers and the like. One variety, known as a sonic oscillator, incorporates a boundary layer control fluid amplifier and a feedback system to control the fluid flow from the amplifier. A sonic oscillator is shown in the patent to R. W. Warren, No. 3,016,066, issued Jan. 9, 1962. This type of oscillator is further shown and described in a more recent Patent No. 3,093,306 also to R. W. Warren, where the oscillator is a basic component in a fluid-operated timer. The Warren oscillators, above, are employed for producing constant successive fluid output pulses the frequencies of which are primarily dependent upon the lengths of the feedback loops and the sizes of the control jet orifices.

A copending application of Chris E. Spyropoulus, Ser. No. 308,038, filed Sept. 10, 1963, now Patent No. 3,217,727 entitled, "Pneumatic Relaxation Oscillator," and assigned to the same assignee as in this application, discloses a second type of pure fluid oscillator known as the relaxation oscillator. This oscillator comprises a boundary layer control fluid amplifier associated with a fluid capacitance. In a typical relaxation oscillator the capacitance is normally a tank and is connected to one of the outputs of the fluid amplifier. This system is set up so that the power jet stream is directed to the tank when the tank is at a low pressure. As the pressure in the tank builds up it forces the stream to shift to the unloaded output until the pressure in the tank has fallen to some lower value, at which time the power jet stream can return to the tank output and allow the pressure to build up again.

The conventional low-frequency fluid oscillator of the relaxation variety, as described above, is constructed such that the time of the output pulse is in general determined by the time it takes to fill a tank somewhere in the circuit. In such oscillators the "dwell-off" time ratio can be adjusted slightly but its degree of adjustment is very limited mainly because the tank must be bled down between the times it is pressurized.

For applications where there is a need for a pure fluid oscillator that will produce an output pulse that timewise is a small fraction of the complete "on-off" cycle, the conventional low-frequency relaxation oscillator is unsatisfactory since the bleed down time of the tank is a considerable percentage of a given cycle.

It is, therefore, an object of the present invention to provide a pure fluid oscillator that has a high "on-off" ratio time.

Another object of this invention is to provide a fluid oscillator that is flexible in that the "on-off" ratio and the frequency of oscillation can be changed with a minimum of effort.

A further object of the instant invention is to provide a fluid blocking oscillator that produces an output pulse of a high amplitude and short duration.

Still another object of this invention is the provision of a fluid blocking oscillator that uses no moving parts, is highly reliable and is inexpensive to manufacture.

According to the present invention, the foregoing and other objects are achieved by providing a blocking oscillator that includes a pure fluid amplifier of the boundary layer lock-on type acting as the main oscillator wherein the switching of its power stream is blocked by a pressure signal supplied by a bleed from a tank in the circuit that is filled and emptied by a separate fluid amplifier. This signal is available to modulate the output pulses of the main oscillator both during the filling and emptying process.

The specific nature of the invention, as well as other objects, aspects, uses and advantages thereof, will clearly appear from the following description and from the accompanying drawing, in which:

FIG. 1 shows a diagrammatic view of the circuit of a preferred embodiment of the invention; and FIG. 2 illustrates waveforms obtained from the embodiment shown in FIGURE 1.

Referring now to FIG. 1, the fluid blocking oscillator circuit is shown to consist essentially of two fluid amplifiers 11 and 12 and a tank or fluid capacitance 13. The fluid amplifiers employed in the blocking oscillator are preferably from the class of amplifiers known as the boundary layer lock-on control type as distinguished from the stream interaction or momentum control type. B. M. Horton describes the control principles involved in both types of fluid amplifiers in his U.S. Patent No. 3,122,165 issued Feb. 25, 1964. French Patent No. 1,278,782 issued to R. E. Bowles and R. W. Warren on Nov. 6, 1961, describes more fully the boundary layer control type fluid amplifier.

As disclosed in the Horton and Bowles et al. patents, supra, in a boundary layer controlled fluid amplifier, a high energy fluid stream referred to as the power jet enters an interaction chamber from a nozzle and is directed toward receiving apertures by the pressure distribution in the power jet boundary layer region. The pressure distribution is influenced by the configuration of the walls of the interaction chamber, the power jet energy level, the fluid transport characteristics, the flow of control fluid to the power jet boundary layer region and the back-loading of amplifier output channels. A further factor that influences the pressure distribution is the placement of the splitter which separates the receiving apertures and channels.

The construction of fluid amplifiers 11 and 12 is well known in the art and specific details may be found in the aforementioned patents. In their most common form, however, the amplifiers are formed by two plates of plastic, glass or metal secured together in fluid tight relation with their nozlzles, apertures, channels, etc., cut or etched out from one of the plates with the other serving as a cover. Amplifiers 11 and 12 are shown schematically in FIGURE 1 in section for convenience. Fluid under pressure is supplied to the power jet nozzle 14 of amplifier 12 and enters the interaction region 15 to be received alternatively by load channel 16 and exhaust channel 17 depending upon the pressure distribution in the interaction region 15. Separating channels 16 and 17 is a splitter 30 which is placed relatively close to nozzle 14 to increase the pressure recovery characteristics of the amplifier and to decrease the memory effect of the amplifier for reasons to be mentioned later. Communicating with the interaction chamber 15, on either side of the power jet nozzle 14, are left control nozzle 18 and right control nozzle 19. Channels 17 and 20 are shown open to ambient conditions. Positioned within left control channel 20, right control channel 21 and exhaust channel 17, are fluid restrictors 22, 23 and 24, respectively, which may take the form of porous plugs, restrictions in the channel walls, valves or the like and whose functions are to act as resistances to fluid flow for reasons to be described later. Load channel 16 communicates, via conduit 25, with a fluid capacitance 13 which may take the form of a fixed volume tank when the fluid used is compressible such as air, or a chamber fitted with a deformable diaphragm if the fluid is incompressible. A feedback path 26 is provided between the load channel conduit 25 and right control orifice 19.

Fluid amplifier 11 acts as the main oscillator in the circuit and is basically the same type of boundary layer control type amplifier as is amplifier 12, comprising a power jet nozzle 27, left and right control nozzles 28 and 29, respectively, interaction chamber 31 and output channels 32 and 33 separated by splitter 34. Left control channel 35 is open to ambient conditions similar to channel 20. Restrictors 36 and 37 are installed in the control chanels of amplifier 11 and are similar to the restrictors employed in amplifier 12.

When the power jet of amplifier 12 is locked on to wall **16*a* to flow through load channel 16, tank 13 is being filled. During this process there is a small flow of fluid from bleed line 39 through restrictor 37 in the right control channel 38 of amplifier 11. With a proper bias on left control nozzle 28, as determined by the restrictor 36, and by appropriately designing the configuration of the interaction chamber 31 to control the pressure distribution in the power jet boundary layer region in ways known to those skilled in the art, this small flow issuing from right control port 29 is sufficient to keep the power jet attached to wall 32*a*** to produce an "off" signal.

In one embodiment, this circuit is set up such that the bias on left control 28 alone is sufficient to maintain the jet stream to the left on wall **32*a*. In this case the pressure in tank 13 must go slightly below ambient or atmosphere, for example, before the bias will be overcome to cause the power jet to switch to the right and lock-on to wall 33*a* to produce an "on" signal. By choosing a suitable high gain amplifier for unit 11, a small negative pressure appearing at right control 29** will be sufficient to cause the switch.

During the tank filling operation there is a flow of fluid in right control 19 of amplifier 12 by means of the feedback path 26 and restrictor 23. Restrictor 23 is chosen so that the flow from right control jet 19 will cause the power jet stream to detach itself from wall **16*a* and switch to the left to exhaust channel 17. This will occur when the pressure in tank 13 is at a value below the maximum pressure recovery of amplifier 12. By relying on the combination of the control jet pressure signal and the back pressure in the load channel to cause the switch of the power jet rather than the back pressure alone (as would normally occur in a non-memory unit), more precise control of the switching is accomplished as well as allowing for a large degree of adjustability of the time of the filling cycle by merely changing restrictors 23 and 22. When the pressure in tank 13 has reached the required value, the power jet of amplifier 12 will switch to the left and start the emptying process. The tank will bleed down by flowing into load channel 16 merging with the power jet to be exhausted to ambient via channel 17 and restrictor 24. During the switching sequence of amplifier 12, amplifier 11 remains in the same state, i.e., the power jet is locked to the left producing an "off" signal. Actually, this is the most stable position for amplifier 11 since the pressure in right control channel 38** is maximum.

Tank 13 will continue to bleed down until the pressure in right control 21 is low enough to cause a switch of the power stream to the right to start filling the tank again. The switch is brought about by means of a bias maintained on the left control of amplifier 12 through the use of restrictor 22 which will cause the amplifier to switch to the right when the pressure on the right control drops to a certain low value. The power stream of the main oscillator, amplifier 11, will be switched to the right to produce an "on" signal in channel 33 at about the same time that the switch occurs in amplifier 12 since the minimum pressure in right control 38 appears at this moment. The power stream of the main oscillator will be producing an "on" signal for only a short time since the pressure at right control jet 29 will r ise rapidly as the tank pressure rises and overcomes the left control bias, thereby causing the power stream to switch to the left to remain there for a long period of blocking.

The operation of the blocking oscillator circuit may be summarized with reference to the waveform of FIG. 2(*a*) which shows a representation of the fluid pressure variation with respect to ambient pressure, designated O, at the output of the "on" channel of the main oscillator 11 as a function of time; and the waveform of FIG. 2(*b*) which is a representation of the variation in pressure at the right control nozzle 29 also of the main oscillator. Assume that at $t=0$, the power jet stream of the timer oscillator, amplifier 12, is locked to the right and is filling tank 13, that the power jet of the output oscillator, amplifier 11, has just switched to the left to produce an "off" signal, and that the pressure in the right control nozzle 29 is at a pressure below ambient but just above the pressure required to overcome the bias of left control nozzle 28. With the power jet of the timer oscillator to the right the pressure at right control nozzle 29 will rise as depicted in FIG. 2(*b*) since tank 13 is being filled. The time rise for the pressure build up in the tank and consequently the pressure rise at right control 29 will be determined from the curve $$r \times C$$

where $r$=the total resistance to the flow of the power jet stream of the timer oscillator as determined mainly by restrictors 37 and 23, and where $C$=the fluid capacitance of tank 13.

When the pressure has reached a point below the maximum pressure recovery of the timer oscillator, its power jet will switch to the left to start emptying the tank. The time drop for the pressure reduction in the tank and consequently the pressure drop in right control nozzle 29 of the output oscillator will be determined from the curve $$R \times C$$

where $R$=the combined effect of the restrictors 37, 23 and 24 and the entrainment of the power jet of timer oscillator 12, and where $C$=the capacitance of the tank.

The pressure will continue to drop to ambient, 0, and further to a negative value, $-1$, developed from the power jet of the timer oscillator entraining fluid from tank 13 after it has bled down to ambient. At this point, the bias on left control nozzle 28 of the output oscillator will switch the power jet issuing from nozzle 27 to the right for the "on" signal. The power jet of the timer oscillator will continue to entrain the fluid from the tank and from its right control channel 21 via feedback path 26 to a minimum pressure. At this time, the bias on left control nozzle 18 will cause the power jet issuing from nozzle 14 to switch to begin another filling cycle. Output oscillator 11 is still producing "on" pulse during this switch and will continue to do so as the pressure builds up in the tank and bleed path 39. When the pressure at right control nozzle 29 reaches a value of $-1$, the bias on left control 28 will be overcome and the power jet of amplifier 11 will be switched to the left to thereby complete an "on" pulse and begin a long period of "off time."

From the above description, it will be readily apparent to those skilled in the art that the "on" and "off" signals produced by the output oscillator, amplifier 11, can be easily varied by changing the resistance values of the restrictors in the circuit and by varying the size of the fluid capacitance.

It will be apparent that the embodiments shown are only exemplary and that various modifications can be made in construction and arrangement within the scope of the invention as defined in the appended claim.

I claim as my invention:

A fluid system comprising:

(a) a first bistable fluid amplifier having a power nozzle and first and second control conduits adjacent thereto, a first output conduit adjacent said first control conduit and a second output conduit adjacent said second control conduit, (b) a second bistable fluid amplifier having a power nozzle and first and second control conduits adjacent thereto, a first output conduit adjacent said first control conduit and a second output conduit adjacent said second control conduit, (c) said first output conduit of said first fluid amplifier being in communication with said first control conduit of said second fluid amplifier, (d) said first output conduit of said first fluid amplifier and said first control conduit of said second fluid amplifier in communication with a fluid capacitance, (e) conduit means communicating said first output conduit of said fluid amplifier with said first control conduit of said first fluid amplifier, (f) said second control conduit and said second output conduit of said first fluid amplifier communicated to ambient by flow restricting means, and (g) said second control conduit of said second amplifier communicated to ambient through flow restricting means.

References Cited by the Examiner

UNITED STATES PATENTS

| | | | |
|---|---|---|---|
| 3,159,168 | 12/1964 | Reader | 137—81.5 |
| 3,175,569 | 3/1965 | Sowers | 137—81.5 |
| 3,185,166 | 5/1965 | Horton et al. | 137—81.5 |
| 3,217,727 | 11/1965 | Spyropoulos | 137—81.5 |
| 3,228,410 | 1/1966 | Warren et al. | 137—81.5 |
| 3,238,959 | 3/1966 | Bowles | 137—81.5 |

OTHER REFERENCES

"Generating Timed Pneumatic Pulses," I.B.M. Technical Disclosure Bulletin, R. E. Norwood, vol. 5, No. 9, February 1963, pp. 13, 14.

M. CARY NELSON, *Primary Examiner.*

S. SCOTT, *Assistant Examiner.*